United States Patent [19]

Choi et al.

[11] Patent Number: 4,700,461
[45] Date of Patent: Oct. 20, 1987

[54] PROCESS FOR MAKING JUNCTION FIELD-EFFECT TRANSISTORS

[75] Inventors: Hong-Kyun Choi, Concord; Bor-Yeu Tsaur, Bedford, both of Mass.

[73] Assignee: Massachusetts Institute of Technology, Cambridge, Mass.

[21] Appl. No.: 913,418

[22] Filed: Sep. 29, 1986

[51] Int. Cl.[4] .................. H01L 21/325; H01L 21/425
[52] U.S. Cl. ..................................... 437/41; 437/238; 437/83
[58] Field of Search .................. 29/571, 576 B, 576 E, 29/576 W; 148/188, 171

[56] References Cited

U.S. PATENT DOCUMENTS

| | | | |
|---|---|---|---|
| 4,101,344 | 7/1978 | Kooi et al. | 148/1.5 |
| 4,199,378 | 4/1980 | van Gils | 148/1.5 |
| 4,277,883 | 7/1981 | Kaplan | 29/571 |
| 4,285,116 | 8/1981 | Meguro | 29/571 |
| 4,371,421 | 2/1983 | Fan et al. | 148/171 X |
| 4,374,698 | 2/1983 | Sanders et al. | 156/643 |
| 4,393,578 | 7/1983 | Cady et al. | 29/576 B |
| 4,437,225 | 3/1984 | Mizutani | 29/576 B |
| 4,466,174 | 8/1984 | Darley et al. | 29/571 |
| 4,489,338 | 12/1984 | Voncken | 357/23 |
| 4,531,282 | 7/1985 | Sakai et al. | 148/188 X |
| 4,533,429 | 8/1985 | Josquin | 156/643 |
| 4,596,068 | 6/1986 | Peters, Jr. | 29/571 |

OTHER PUBLICATIONS

"Junction Field-Effect Transistors", *Physics and Technology of Semiconductor Devices*, A. S. Grove, John Wiley & Sons, 1967, p. 243.
"Local Oxidation of Silicon: New Technical Aspects", J. A. Appels and M. M. Paffen, *Philips Research Reports*, vol. 26, No. 3, pp. 157-165, Jun. 1971.
IBM Technical Disclosure Bulletin, vol. 22, No. 7, Dec. 1979, "Self-Aligned Silicon MESFET or JFET", Ning et al., pp. 2918-2921.
"A Vertical FET with Self-Aligned Ion-Implanted Source and Gate Regions, Ozawa et al., *IEEE Transactions on Electron Devices*, vol. ED-25, No. 1, Jan. 1978.
"Radiation-Hardened Silicon-On-Insulator Complementary Junction Field-Effect Transistors", Tsaur et al., *IEEE Electron Device Letters*, vol. EDL-7, No. 5, May 1986.

*Primary Examiner*—George T. Ozaki
*Attorney, Agent, or Firm*—Hamilton, Brook, Smith & Reynolds

[57] ABSTRACT

A self-aligned integrated JFET device is described wherein an oxide extension region and a doped polysilicon gate is used as part of a self-aligned mask to form drain and source regions. Asymmetric JFETs for power circuit applications can be made in accordance with the invention. Additionally, complementary enhancement mode JFETs can be made in accordance with the invention, for low power consumption and excellent radiation-hardened characteristics.

21 Claims, 6 Drawing Figures

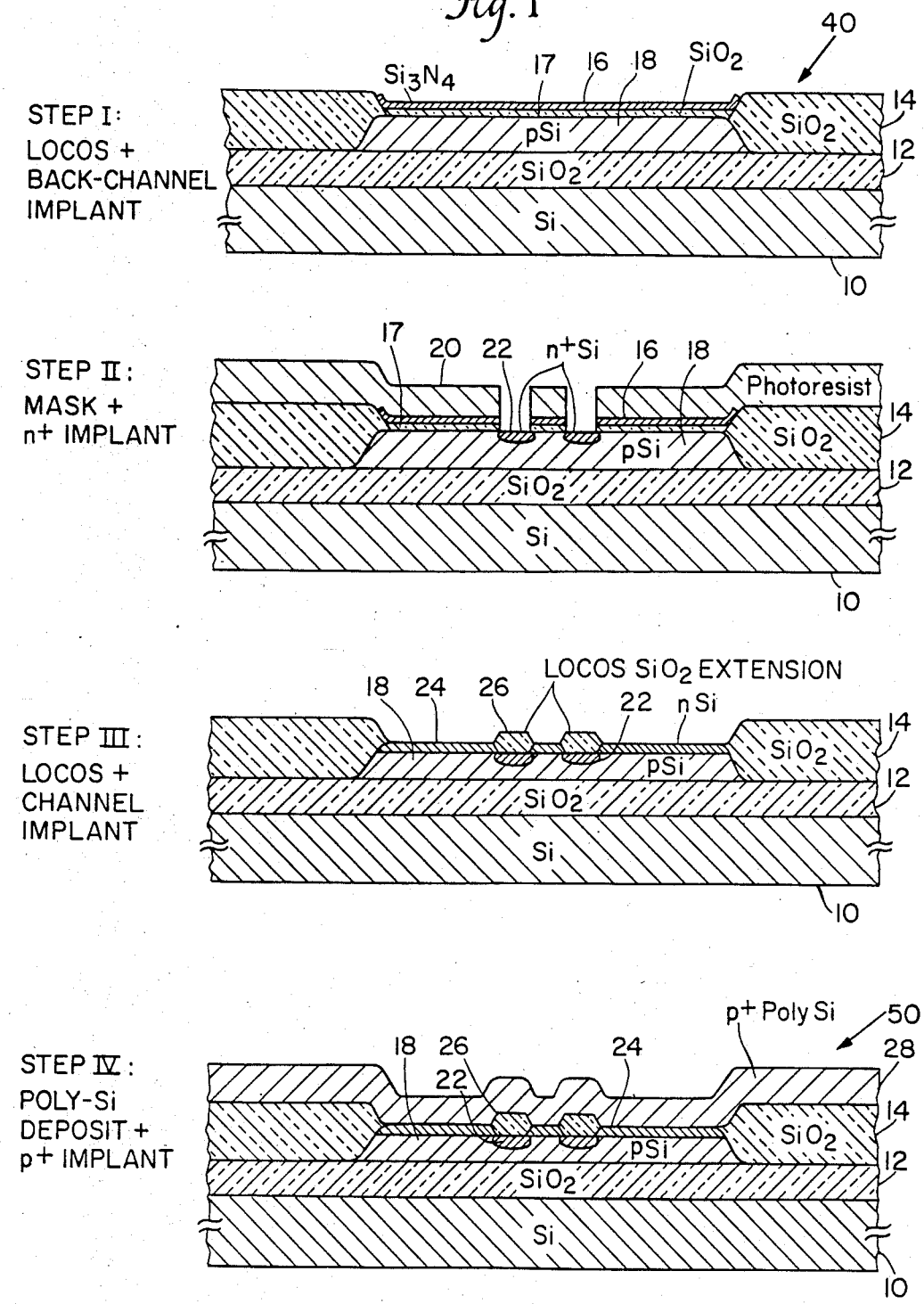

Fig. 1
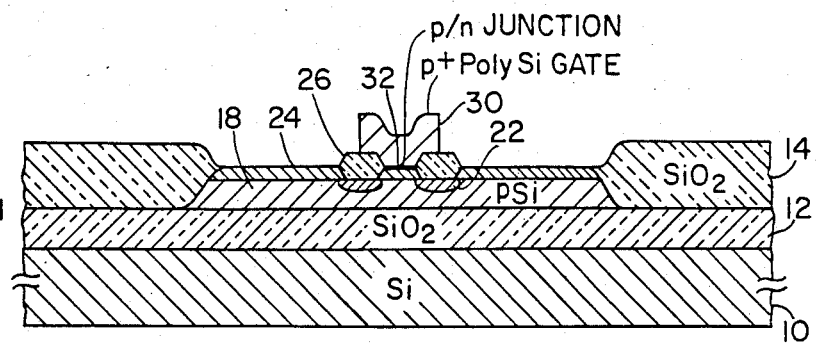
STEP V:
POLY-Si
ETCHING +
p+ DIFFUSION
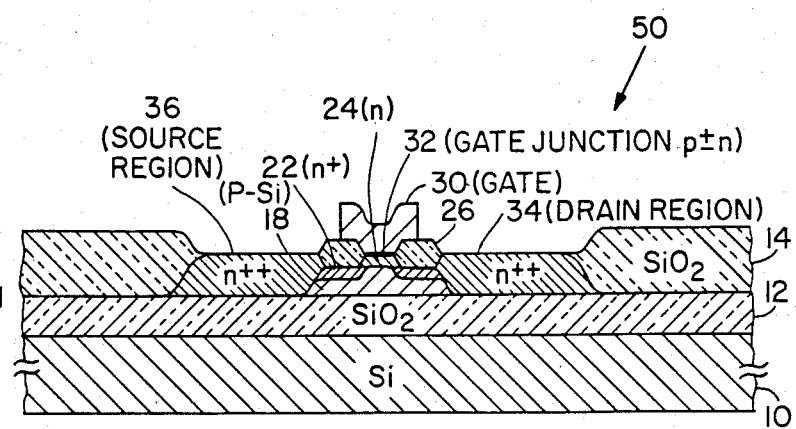
STEP VI:
SOURCE/
DRAIN
IMPLANTATION

PROCESS FOR MAKING JUNCTION FIELD-EFFECT TRANSISTORS

GOVERNMENT RIGHTS

The United States Government has rights in this invention pursuant to U.S. Air Force Contract No. F19628-85-C-0002.

BACKGROUND ART

The development of the junction field-effect transistor (JFET) dates back to 1952, when the JFET was first proposed by W. Schockley. The n-JFET comprises, in general, an n-type channel layer and a p-type gate formed in the n-type layer from the top. Contact is made to the p-region and the two n-regions at either side of the top gate, resulting in respective gate, source and drain contacts. The p-JFET has a p-type channel layer and an n+ gate. In the JFET, the depletion region of a p-n junction is used to modulate the cross-sectional area available for current flow. The current is transported by carriers of one polarity only; hence, it is customary to refer to the field-effect transistor as a unipolar device in contrast to the earlier developed bipolar junction transistor which operates through the injection of minority carriers (*Physics and Technology of Semiconductor Devices*, A. S. Grove, John Wiley & Sons, 1967, p. 243).

Presently, the unipolar metal oxide semiconductor field effect transistor (MOSFET) is of far greater commercial importance than the JFET. The MOSFET is a type of surface field-effect transistors. In general, the MOSFET has a source and drain region of n-type or p-type material connected by a narrow channel of semiconductor material. A gate is formed above the channel, but is insulated from the semiconductor material by a thin oxide layer (usually $SiO_2$). The $SiO_2$ layer is made sufficiently thin that an electrostatic field produced by a bias voltage on the gate penetrates and controls the conductivity of the channel.

Despite the present popularity of MOSFETs, the JFET has inherent advantages over the MOSFET for certain applications. For example, because there is no gate oxide, JFETs are more suitable for high temperature operation than MOSFETs. In MOSFETs, mobile ions in the gate oxide migrate during operation, causing threshold voltage shifts. The migration rate of mobile ions increases exponentially with temperature.

JFETs are also inherently less sensitive to total dose radiation than MOSFETs. In MOSFETs, charge trapping in the gate oxide during irradiation generally produces a large shift in threshold voltage. While this shift can be substantially reduced by using a very thin (10 nm) gate oxide, it appears that a practical upper limit of $10^7$ rad (Si) total-dose resistance exists.

From the above discussion, it may be concluded that the thin gate oxide inherent in MOSFETs is a necessary evil. This is not entirely true, since the gate oxide does provide a significant self-alignment advantage over conventionally fabricated JFET devices.

The MOSFETs are generally fabricated in a "self-aligned" manner. The source and drain, which are formed by ion implantation using the polysilicon gate and oxide for masking, are "self-aligned" with respect to the gate. This processing is possible because the gate is isolated from the heavily-doped source and drain by the gate oxide. In contrast, conventionally fabricated JFETs are not "self-aligned". The gate needs to be photolithographically aligned between the source and drain to avoid shorting. In the non-self-aligned structure, the source and drain parasitic resistances can be high, resulting in low transconductance and output driving capability. Therefore, a need exists for a method of fabricating a self-aligned JFET.

Additionally, a need exists for integrated JFET devices capable of being fabricated by simple and reliable processing steps on thin Si films isolated from an Si substrate by a buried insulating layer, i.e., silicon on insulator (SOI) devices. Because the active semiconductor volume of such devices is small and the devices are dielectrically isolated, such SOI devices are less susceptible than bulk silicon devices, both to logic upset and latch-up induced by transient radiation and single-event upset.

DISCLOSURE OF THE INVENTION

The invention relates to a method in which self-aligned JFETs are formed with source and drain regions and the device resulting therefrom. For convenience, an n-JFET is used below to summarize the invention. A p-JFET can be similarly made by reversing the type of conductivity. In the first step of the process, a potential Si region for forming JFET devices is isolated on a suitable substrate by a local oxidation of silicon (LOCOS) planar process. (See Philips Research Reports, Vol. 26, pp. 157–165, 1971, J. A. Appels and M. M. Paffen "Local Oxidation of Silicon: New Technical Aspects".)

The substrate can be bulk single-crystal Si silicon-on-insulator (SOI) or silicon-on-sapphire (SOS). Silicon-on-insulator substrates are used here for the illustration of the self-aligned process.

In the SOI embodiment, the silicon film is formed by zone-melting and recrystallization (ZMR) of polycrystalline Si formed on an $SiO_2$/Si body. The polycrystalline Si films are transformed to single crystal films upon recrystallization. (See U.S. patent application Ser. No. 805,117 filed 12/4/85 to Chen et al., entitled "Capping Technique for Zone-Melting Recrystallization of Insulated Semiconductor Films".

In the LOCOS process, the isolated region of Si is covered with an oxide layer and a nitride layer. A p-type dopant is ion-implanted in the Si to form an isolated p-type back channel silicon region beneath the layers of oxide and nitride.

Next, a mask and suitable photoresist and etchant is used to define two closely spaced regions by etching the nitride and oxide layers to the underlying surface of the isolated p-type Si back channel region. A suitable n-type dopant is implanted in the two exposed surfaces of p-type Si to form two n+ regions within the p-type back region. Preferably, the dopant dosage for the n+ regions produces a typical concentration of about $10^{18}$ $cm^{-3}$. These n+ regions reduce the source and drain resistances, but the amount of dopant is not high enough to degrade the gate junction quality.

Next, $SiO_2$ extension regions are formed above each of the n+- regions using the LOCOS process above-described. The remaining nitride and oxide layers are subsequently removed. The regions not covered by oxide are then ion-implanted with n-type dopant for adjustment of threshold voltage. A p+-type polysilicon layer is formed over the top layer by depositing polysilicon and heavily doping the deposited silicon with p-type dopant, preferably by ion implantation.

A gate region is then formed over the channel and oxide extension region by etching the p+-type polysilicon away from non-gate areas. Diffusion from the remaining p+-type polysilicon gate region produces a shallow p+n junction beneath the polysilicon gate region. This junction is isolated on side edges by the LOCOS oxide extension previously formed beneath the gate region.

Finally, n++ source and drain regions, having a typical concentration of about $10^{20}$ cm$^{-3}$, are formed on either side of the gate region by ion implantation of n-type dopants using the LOCOS-oxide extension regions and p+ polysilicon gate region for masking. Thus, the source and drain regions are self-aligned with respect to the oxide extension regions. This high doping concentration of the source and drain regions reduces contact resistance. It should be noted that the n+ and n++ regions are separately controllable in this process, lending great flexibility in tailoring transistor parameters.

The end result of the process of the invention is an n or p-type JFET with a back channel of one type conductivity underlying a channel region of opposite conductivity with a p-n junction formed in the channel region. A polysilicon gate region overlies the p-n junction between an oxide extension region in contact with peripheral edges of the junction. A second region of opposite conductivity is formed below the oxide extension region; and source and drain regions of opposite conductivity extend from peripheral sides of the oxide extension region remote from the channel region. By virtue of the processing steps, the concentration of the source and drain regions can be made much greater than that of the second regions.

As will be explained in the detailed description which follows, the invention also relates to fabrication of self-aligned complementary JFETs on substrates for low power consumption and also to fabrication of asymmetric source and drain JFETs for high voltage power circuit applications.

BRIEF DESCRIPTION OF THE DRAWINGS

FIG. 1 is a schematicized partial cross-sectional view of various stages in the fabrication of a self-aligned JFET in accordance with the invention.

DETAILED DESCRIPTION OF THE INVENTION

Figure 2:
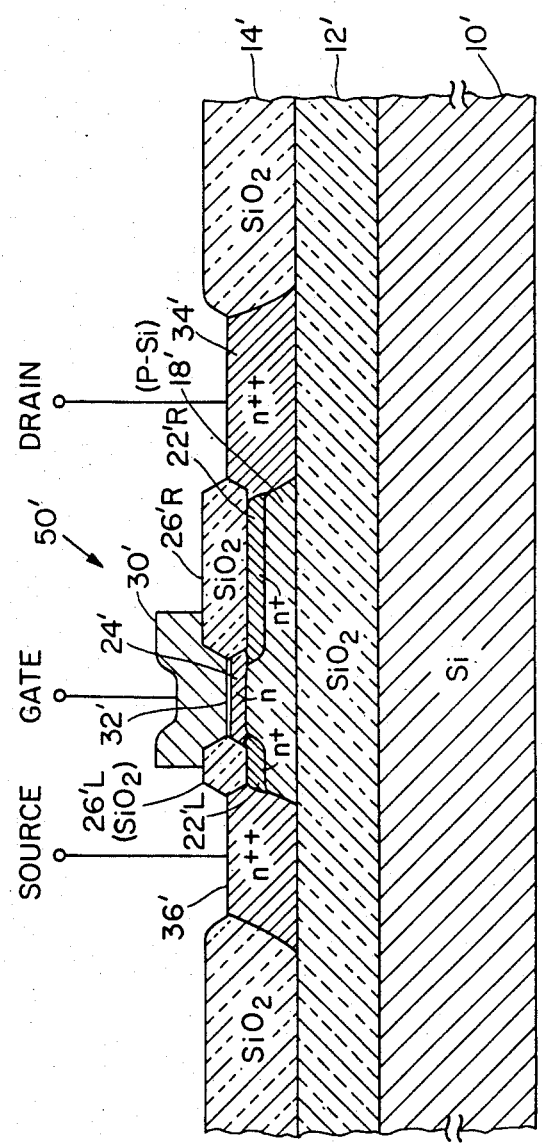
FIG. 2 is a schematicized partial cross-sectional view of a finished asymmetric self-aligned high voltage JFET in accordance with the invention.

Referring now to FIG. 1, the detailed processing steps for fabricating a self-aligned JFET 50, in accordance with the invention, will be described. The invention will be illustrated in connection with a silicon on insulator substrate, together with a LOCOS isolation process. However, any isolation technique available for use with bulk silicon circuit fabrication may be combined with the described processing steps, to fabricate self-aligned JFET circuits on bulk silicon substrates, in accordance with the invention.

Step I of FIG. 1 shows the precursor structure 40 and illustrates the process of LOCOS isolation and back channel implantation of a p-type substantially single-crystalline silicon region on an SiO$_2$ film-on-silicon body. In this step of the process, single-crystalline silicon islands 18 are isolated by SiO$_2$ regions 14 formed by local oxidation of a silicon film formed on the SiO$_2$ film.

Preferably, the single crystalline silicon film 18 is formed by zone-melting recrystallization of a polycrystalline silicon film deposited on an SiO$_2$ insulator layer 12 which was previously formed on a silicon body 10. The polycrystalline silicon film is transformed to a single crystalline film 18 upon recrystallization. The single crystalline silicon film 18 is then covered with an oxide layer 17, preferably formed of SiO$_2$, and a nitride layer 16, preferably formed of Si$_3$N$_4$. A mask is used to etch the Si$_3$N$_4$ layer 16 and SiO$_2$ layer 17 outside the region where devices are to be fabricated. Oxide 14 is selectively grown in the region where layers 16 and 17 are removed. A back channel 18, is formed by ion implanting a p-type dopant, such as boron, through the Si$_3$N$_4$ layer 16 and the SiO$_2$ layer 17. Thus, an isolated p-type silicon region 18 is formed beneath layers 17 and 16 of SiO$_2$ and Si$_3$N$_4$, respectively.

In Step II, a mask is used to define two closely spaced regions in a photoresist layer 20 through which a suitable etchant is used to etch the SiO$_2$ and Si$_3$N$_4$ layers, exposing the underlying surface of the isolated p-type silicon region 18. A suitable n-type dopant is then implanted in the two exposed regions of p-type silicon to form two n+-regions 22 within the p-type region 18.

Next, in Step III, the photoresist 20 is removed and an oxide extension region 26 is formed above each of the n+ regions 22 using the above-described LOCOS process. The nitride and oxide layers, respectively, 16 and 17, are removed. The regions not covered by either the SiO$_2$ layer 14 or the LOCOS silicon extension regions 26, are then ion-implanted with n-type dopant to form regions 24 of n-type silicon on either side of the LOCOS silicon extensions 26 and between such extensions for threshold adjustment.

In Step IV, a p+-type polysilicon layer 28 is formed by first depositing polysilicon over the entire layer and then doped with p-type dopant, preferably formed by ion implantation.

Next, in Step V, a gate region is formed over the oxide extension region by etching the p+-type polysilicon layer 28 away from non-gate areas leaving a p+ polysilicon gate 30 extending over and between the oxide extension regions 26. A p+-n junction 32 is formed between the oxide extension regions by diffusion of p+ impurities from the p+ polysilicon gate region 30 to the surface of the underlying n region 24.

This shallow junction 32 is isolated on all sides by the LOCOS oxide extension 26, previously formed beneath the p+ polysilicon gate 30.

Finally, n++ source and drain regions 36 and 34, respectively, are formed on either side of the gate region by ion implantation of n-type dopants using the LOCOS-extension regions 26 and the p+ polysilicon gate region 30 for masking. In this manner, the source and drain regions are self-aligned with respect to the outer edge of the oxide extension regions.

The back channel implantation region 18 of p-type single crystal silicon, insures uniformity in channel height despite slight local variations in the thickness of the original silicon layer. The n-type doping below the LOCOS oxide extensions is sufficient to reduce the source and drain resistance without degrading gate junction quality.

Diffusion from the doped polysilicon gate region produces a very desirable relatively shallow junction. The dopant dosage used for polysilicon doping is preferably high enough, to insure low resistivity in the polysilicon gate 30. Devices have been fabricated with a nominal gate width of about 30 microns and a gate length of 2 microns and a source-drain spacing of about 6 microns.

Figure 4:
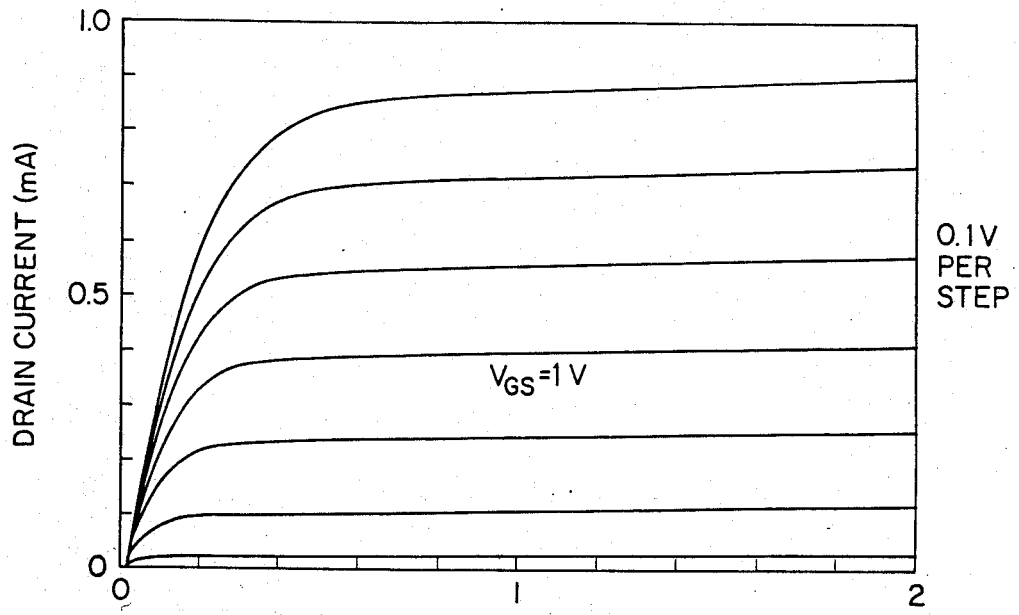
FIG. 4 is a plot of the transistor characteristics of a self-aligned n-JFET made in accordance with the invention.

The transistor characteristics of self-aligned SOI n-JFETs of 2 microns nominal gate length and 30 microns gate width, fabricated as described above, are plotted in FIG. 4. The transistor exhibits a transconductance value of about 60 mS/mm.

In order to investigate whether the self-aligned processing procedure, above described, is suitable for large scale circuit fabrication, threshold voltage distribution was measured. Threshold voltage distribution for 94 transistors, made in accordance with the invention, within an area of about $1.5 \times 3$ cm$^2$. Such measurements produced a mean of 594 millivolts and a standard deviation of about 13.5 millivolts, which compares favorably with the best values obtained in gallium arsenide MESFET technology.

Devices fabricated in accordance with the invention, have exhibited high transconductance, low output conductance, and good threshold voltage uniformity. Excellent radiation resistance, up to $10^8$ rad (Si), has been observed with respect to threshold voltage and transconductance.

Referring now to FIG. 2, a high voltage JFET 50' will now be described. It should be noted that in the drawing of FIG. 2, like items in FIG. 1 carry the same numeral designation, except that in FIG. 2, a prime is added and, in addition, items to the left side of the gate region, as viewed by the reader, carry an "L"-suffix, while items to the right carry an "R"-suffix.

In the device of FIG. 2, the structure is fabricated utilizing the same basic processing steps as in FIG. 1. Therefore, only exceptions need to be described herein. The n+ region 22'R between the gate channel region 24' and the drain region 34' is intentionally made longer in width than the corresponding region 22'L between the source region 36' and the gate channel 24'. An asymmetric oxide extension region is thus formed comprising right oxide extension region 26'R and left region 26'L. The short extension region between the source and gate insures high transconductance of the device, while the long extension region between the drain and gate results in high breakdown voltage. In addition, the doping below the LOCOS extension may be lowered for higher breakdown voltages.

The above may be accomplished by modifying the mask of Step II, in FIG. 1, to laterally extend the n+ silicon region 22, as compared to the region on the other side. Similarly, the LOCOS SiO$_2$ extension regions 26, are formed asymmetrically. In other respects, the process proceeds, as described in subsequent Steps IV–VI.

Figure 3:
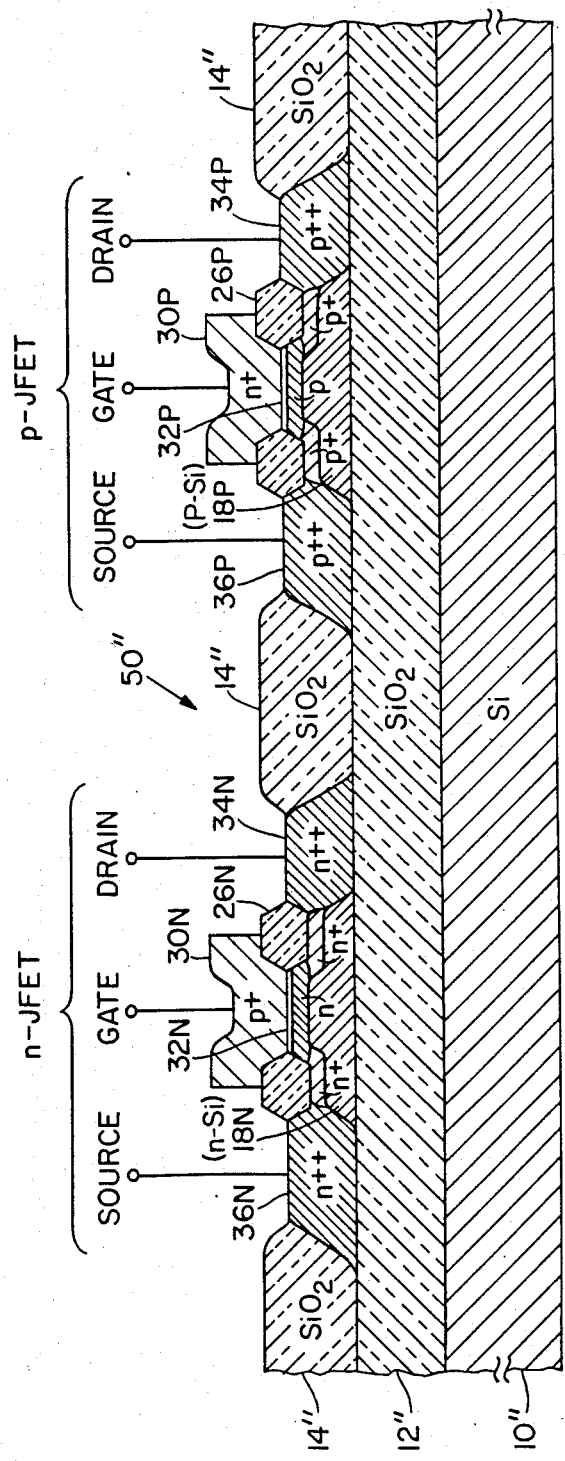
FIG. 3 is a schematicized partial cross-sectional view of a finished complementary silicon on insulator JFET in accordance with the invention.

Referring now to FIG. 3, an integrated complementary JFET device 50" is shown manufactured in accordance with the principals illustrated in FIG. 1 of the drawings. As may be seen from a comparison of the n-JFET device of FIG. 3, with the finished n-JFET 50 of FIG. 1, the structures are identical. Thus, like items in FIG. 3 carry the same numeral designation, with an "N"-suffix denoting that it is an n-JFET.

Similarly, to the right of the n-JFET device of FIG. 3, a p-JFET is constructed in precisely the same manner, using opposite conductivity doping during the processing steps to produce a p-JFET on the same SiO$_2$/Si substrate. The p-JFET carries like numeral designations with a "P"- suffix. The complementary JFETs 50" of FIG. 3 offer the same advantages of low power operation, and simple circuit design as CMOS circuits, but with much greater potential for radiation-hardened integrated circuits.

In the complementary JFET of FIG. 3, the transistors operate in the enhancement or "OFF" mode, wherein the threshold voltage is greater than zero. Thus, very low standby power consumption is required, similar to that of CMOS circuits. In addition, since the JFET is capable of operation at lower voltages than CMOS, the JFET is an inherently lower power consumption device.

Figure 5:
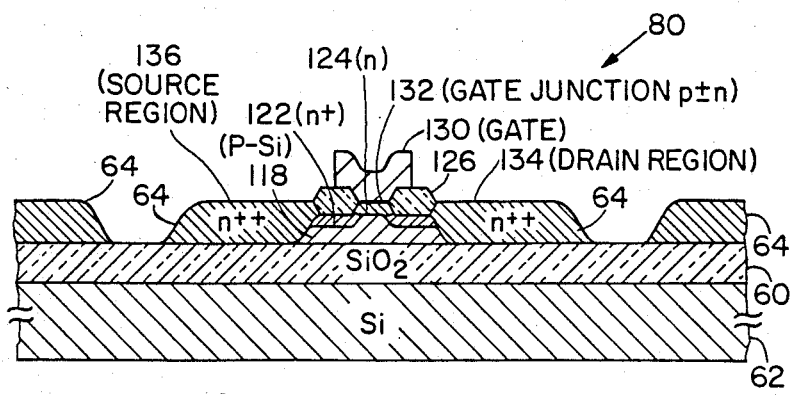
FIG. 5 is a schematicized partial cross-sectional view of a mesa-type embodiment of the invention.

Referring now to FIG. 5, an alternate embodiment of the invention is illustrated, in which a JFET 80 is fabricated on an insulator 60 of SiO$_2$, utilizing mesa isolation of the active JFET device. In this embodiment, the starting structure comprises a layer of Si on an insulator layer 60, of SiO$_2$, on a silicon body 62. The Si layer is etched down to the SiO$_2$ to form isolated mesas 64 of silicon, in which individual JFETs may be formed. One such JFET is shown in FIG. 5. As may be seen from a comparison of FIG. 5 with the JFET 50 of FIG. 1 the JFET of FIG. 5 is substantially identical and, therefore, may be made in accordance with Steps II–VI of FIG. 1. Note that in FIG. 5, items corresponding to like items in FIG. 1 carry the same numeral designation preceded by the prefix numeral "1". Similarly, in the bulk silicon embodiment of FIG. 6, described below, the prefix numeral "2" is used for like items.

Figure 6:
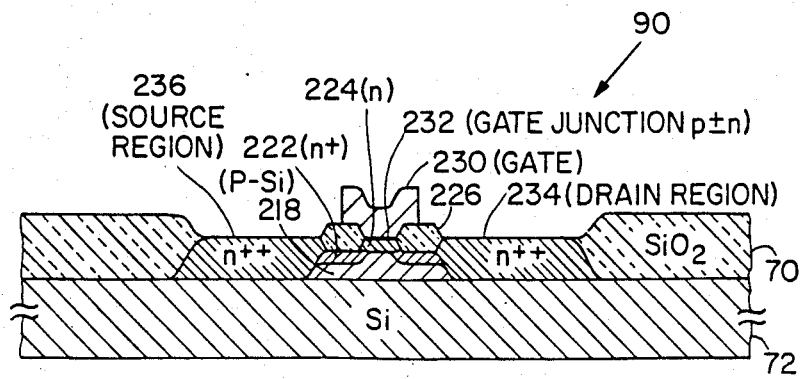
FIG. 6 is a schematicized partial cross-sectional view of an embodiment of the invention fabricated on bulk silicon.

In the embodiment of FIG. 6, the active JFET device is fabricated on bulk silicon 72, using the LOCOS process to form an isolation ring 70 about the active JFET device 90. The active device is fabricated in accordance with Steps II–VI of FIG. 1.

EQUIVALENTS

This completes the description of the preferred embodiments of the invention. While the invention has been particularly shown and described with reference to such embodiments, it should be understood that those skilled in the art will be capable of devising various changes in form and details without departing from the spirit and scope of the invention. For example, while specific n-type and p-type dopants have been recited in the description, it should be clear that a great variety of such dopants exist. For example, suitable n-type dopants may comprise impurities, such as arsenic, antimony or phosphorus, while suitable p-type dopants may comprise materials, such as boron, boron fluoride or gallium.

We claim:

1. A method of forming a junction field-effect transistor on a substrate comprising the steps of:
   (a) forming an island of silicon on, or in, said substrate;
   (b) doping said island with one type of conductivity dopant;

(c) forming two closely spaced regions of opposite conductivity in said island extending to an upper surface of said island;

(d) forming oxide extension regions over said opposite conductivity regions;

(e) forming opposite conductivity regions on either side of said oxide extension regions and between said regions;

(f) forming a silicon gate region of said one type conductivity over said oxide extension regions, and the opposite conductivity region therebetween, to form a shallow p-n junction adjacent the interface between the silicon gate region and the underlying region between the oxide extensions; and (g) forming source and drain regions of opposite conductivity at either side of the gate region using the oxide extension regions and gate region as a mask.

2. The method of claim 1 wherein the substrate comprises bulk single crystal silicon or silicon-on-insulator.

3. The method of claim 2 wherein the silicon-on-insulator substrate is silicon-on-sapphire.

4. The method of claim 1 wherein the source and drain regions are of n-type conductivity and the gate region of p-type conductivity.

5. The method of claim 1 wherein the source and drain regions are of p-type conductivity and the gate region of n-type conductivity.

6. The method of claim 1 wherein the precursor for forming the substrate in step (a) is a single crystalline silicon film formed by zone melting and recrystallization of a polysilicon film formed on an $SiO_2/Si$ substrate.

7. The method of claim 1 wherein the island is isolated by local oxidation of selected areas of silicon.

8. The method of claim 1 wherein the island is isolated by etching of silicon to form mesa structures down to the upper substrate surface.

9. The method of claim 1 wherein the oxide extension regions are formed by selective oxidation.

10. The method of claim 1 wherein the regions formed in step (c) are formed by ion-implantation of dopant ions.

11. The method of claim 1 wherein the regions formed in steps (c) and (d) are asymmetric in width.

12. A method of forming an integrated junction field-effect device on a substrate comprising the steps of:

(a) forming an isolated device region of substantially single crystal silicon on a substrate;

(b) providing an impurity of one type conductivity in said device region;

(c) forming two closely spaced regions of opposite conductivity in said device region at exposed surfaces thereof;

(d) forming oxide extension regions over said opposite conductivity regions;

(e) forming opposite conductivity regions on either side of said oxide extension regions and between said regions;

(f) forming a polysilicon layer of said one type conductivity over said opposite conductivity regions and oxide extension regions;

(g) selectively removing said polysilicon layer to leave a gate region extending over and between the oxide extension regions to form a shallow junction adjacent the interface between the gate region and the underlying opposite conductivity region between the oxide extension regions; and (h) forming source and drain regions of opposite conductivity at either side of the gate region using the oxide extension regions and gate region as a mask.

13. The method of claim 12 wherein the source and drain regions are of n-type conductivity and the gate region of p-type conductivity.

14. The method of claim 12 wherein the source and drain regions are of p-type conductivity and the gate region of n-type conductivity.

15. The method of claim 13 wherein a second integrated junction field-effect device is formed adjacent the device of claim 12 on the same substrate in parallel with the steps of claim 12 and wherein the source and drain regions are of p-type conductivity and the gate region of n-type conductivity.

16. The method of claim 12 wherein the substrate comprises bulk silicon, or silicon-on-insulator.

17. The method of claim 16 wherein the silicon-on-insulator substrate is silicon-on-sapphire.

18. The method of claim 12 wherein the device region is formed by selective oxidation of silicon by masking with an oxide/nitride layer and the impurity of one type conductivity is implanted through opening maid in said oxide/nitride layer.

19. The method of claim 18 wherein the oxide extension regions are formed by selective oxidation of silicon through openings in said oxide/nitride layer.

20. The method of claim 12 wherein the regions formed in step (h) are more heavily doped than the regions formed in step (c) and the regions formed in step (c) are more heavily doped than the regions formed in step (e).

21. The method of claim 12 wherein the regions formed in steps (c) and (d) are asymmetric in lateral width.

* * * * *

UNITED STATES PATENT AND TRADEMARK OFFICE
CERTIFICATE OF CORRECTION

PATENT NO. : 4,700,461
DATED : Oct. 20, 1987
INVENTOR(S) : Hong-Kyun Choi and Bor-Yeu Tsaur It is certified that error appears in the above—identified patent and that said Letters Patent is hereby corrected as shown below:

Claim 18, line 4, delete "opening maid" and insert ---openings made---.

Signed and Sealed this

Twenty-second Day of March, 1988

Attest:

DONALD J. QUIGG

Attesting Officer

Commissioner of Patents and Trademarks